(12) United States Patent
Baumgartner et al.

(10) Patent No.: US 7,940,878 B2
(45) Date of Patent: May 10, 2011

(54) UNLOCK MODE IN SOURCE SYNCHRONOUS RECEIVERS

(75) Inventors: Steven J. Baumgartner, Zumbro Falls, MN (US); Timothy C. Buchholtz, Rochester, MN (US); Andrew D. Davies, Rochester, MN (US); Thomas W. Liang, Rochester, MN (US); Andrew B. Maki, Rochester, MN (US); Thomas Pham, Rochester, MN (US); Dana M. Woeste, Mantorville, MN (US); Daniel G. Young, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 1112 days.

(21) Appl. No.: 11/678,256

(22) Filed: Feb. 23, 2007

(65) Prior Publication Data

US 2008/0205570 A1 Aug. 28, 2008

(51) Int. Cl.
*H03D 3/24* (2006.01)
*H04L 7/00* (2006.01)

(52) U.S. Cl. .................................. 375/376; 375/355

(58) Field of Classification Search .............. 375/355, 375/371, 373, 376
See application file for complete search history.

(56) References Cited

U.S. PATENT DOCUMENTS

| 5,475,877 A | * | 12/1995 | Adachi | 455/343.2 |
| 7,420,361 B2 | * | 9/2008 | Lin et al. | 324/76.55 |
| 7,426,018 B2 | * | 9/2008 | Wassink | 355/67 |
| 2005/0069071 A1 | * | 3/2005 | Kim et al. | 375/355 |

* cited by examiner

*Primary Examiner* — David B Lugo
(74) *Attorney, Agent, or Firm* — Bockhop & Associates LLC

(57) ABSTRACT

A phase locked loop generates an output corresponding to a source synchronous input and an input link clock signal. A phase locking feedback system receives the input and an input link clock signal and detects phase deviations between the output and the input. The phase locking feedback system also adjusts an adjusted clock signal based on the phase deviations thereby causing the phase locking feedback system to generate the output so that the output has a steady phase relationship with the input. A first mechanism causes the phase locking feedback system not to track phase deviations between the output and the input upon occurrence of a first predefined event, thereby maintaining the adjusted clock signal at a current state.

20 Claims, 2 Drawing Sheets

UNLOCK MODE IN SOURCE SYNCHRONOUS RECEIVERS

BACKGROUND OF THE INVENTION

1. Field of the Invention

The present invention relates to digital data communications and, more specifically, to a system for receiving a data stream that is source synchronous with a received clock.

2. Description of the Prior Art

Most digital circuits employ some sort of clocking circuit to generate a series of clock pulses that activate latches throughout the circuit. When a clock pulse is asserted, a latch is enabled to acquire and store a data value from a logic unit. By asserting clock pulses periodically, data values are able to propagate through the circuit in an orderly manner, thereby ensuring that any given data unit is correctly paired with a corresponding data unit at the beginning of a logical operation.

Some clock signals are received by circuits that employ phase locked loops (PLLs) that sense when a given clock pulse is slightly out of phase with sequential pulses in a clock signal and correct a pulse when such an out of phase relationship is detected. Thus, a slight delay in a received clock pulse will not interfere with the normal timing of operations in a synchronous circuit.

A source synchronous data communications system is one in which a data signal and a corresponding clock signal have been generated from the same original frequency generator and both are transmitted somewhere else. The receiver employs the clock signal to determine when the data on the data signal may be sampled. However, as data transmission speeds increase or the two signal travel through different circuits and for different lengths of transmission media, phase deviations between the clock signal and the data signal develop so that if the receiver relies only on the clock signal, the receiver may not sample data from the data signal at the correct time. These phase deviations may result from several phenomena, including changes in operating temperature, transmission line effects and differences in the frequency response of different circuit elements in the path of the data signal and the clock signal.

To overcome the effect of such phase deviations, some source synchronous systems employ a phase locked loop in which feedback regarding the received data signal is used to adjust the phase of the clock signal to ensure that data sampling occurs at the correct time. Such systems sample the data and provide phase feedback continuously. This is not strictly necessary when the received data is coming from a source synchronous transmitter, nor is it entirely beneficial for certain types of transmitted data patterns. For example, if a data stream includes a long chain of 0's or 1's, the phase locked loop may drift out of lock anyway and start choosing incorrect phase alignments. Also, in cases where short "010" or "101" pattern pulses are runted, i.e., the leading edge of the pulse is late and the trailing edge is early, the runt data patterns can be missed by the receiver completely as the phase locked loop adjustment drifts over time, or the runt pulse can even through the loop out of phase alignment.

Continuously running phase locked loop systems also have the disadvantage of consuming excess power and generating excess heat during steady state operation. This is because once the phase of the clock signal has been aligned with the phase of the data signal in a source synchronous system, the clock signal will normally remain aligned unless some sort of perturbation occurs in the system and, thus, there is no need to continue providing feedback during normal operation. This disadvantage increases in importance as circuit density increases.

Therefore, there is a need for phase locked loop system in which the feedback system operates only during selected periods necessary to align the clock signal with the data signal.

SUMMARY OF THE INVENTION

The disadvantages of the prior art are overcome by the present invention which, in one aspect, is a phase locked loop that generates an output corresponding to a source synchronous input and an input link clock signal. A phase locking feedback system receives the source synchronous input and an input link clock signal and detects phase deviations between the output and the source synchronous input. The phase locking feedback system also adjusts an adjusted clock signal based on the phase deviations thereby causing the phase locking feedback system to generate the output so that the output has a steady phase relationship with the source synchronous input. A first mechanism causes the phase locking feedback system not to track phase deviations between the output and the source synchronous input upon occurrence of a first predefined event, thereby maintaining the adjusted clock signal at a current state.

In another aspect, the invention is an apparatus for deserializing a serial data stream from a source synchronous system that also generates an input link clock signal. A deserializer, responsive to the serial data stream and an adjusted clock signal that has an adjusted clock signal period, generates a stream of parallel data samples corresponding to the serial data stream. The deserializer also generates a receiver functional clock signal so that the receiver functional clock signal is indicative of when each of the parallel data samples is valid. The receiver functional clock signal has a period that is a predetermined multiple of the adjusted clock signal period. The deserializer also generates a stream of edge samples indicative of a corresponding plurality of value transitions of the parallel data samples. A phase rotator, that is responsive to a shift clock signal and to the input link clock signal from the source synchronous system, generates the adjusted clock signal so that the adjusted clock signal corresponds to the input link clock signal shifted by an amount of time and in a direction indicated by the shift clock signal. A phase detector, that is responsive to the parallel data samples and the edge samples, generates the shift clock signal so as to indicate the amount of time and the direction that the adjusted clock signal must be shifted from the input link clock signal so that the parallel data samples accurately correspond to the input serial data stream. The phase detector is configured to generate a fixed value of the shift clock signal upon an occurrence of a first predefined event.

In yet another aspect, the invention is a method of operating a deserialzer that deserializes a serial data stream into a parallel data stream, in which a parallel data stream corresponding to the serial data stream based on the adjusted clock signal is generated. A phase shift direction and amount of the adjusted clock signal necessary to align the adjusted clock signal with the serial data stream based on the parallel data stream is detected. The adjusted clock signal is adjusted by the phase shift direction and amount. When the parallel data stream is in phase with the serial data stream is detected. Once the parallel data stream is in phase with the serial data stream, the adjusting of the adjusted clock signal ceases.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1:
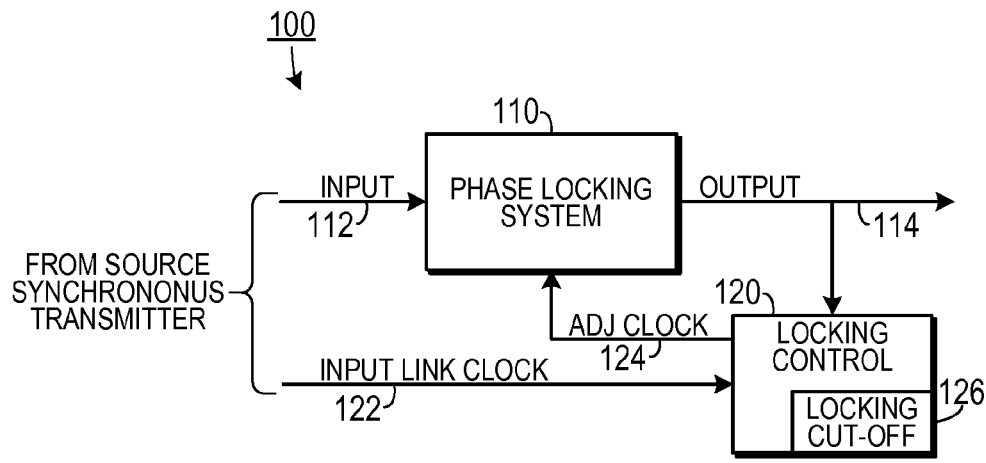
FIG. 1 is a block diagram of a representative embodiment.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

As shown in FIG. 1, in one embodiment a phase locked loop 100 includes a source synchronous phase locking system 110 and a phase locking feedback control system 120. The source synchronous phase locking system 110 receives a source synchronous input 112 from a data source and generates an output 114 corresponding to the input 112. The phase locking feedback control system 120 receives a source synchronous input link clock signal 122 (typically from the same unit creating the data source) corresponding to the input 112 and samples the output 114. Based on the sampling of the output 114, the phase locking feedback control system 120 detects phase deviations between the output 114 and the input 112.

Based on the detected phase deviations, the phase locking feedback control system 120 generates an adjusted clock signal 124 that is a phase-shifted copy of the input link clock signal 122. The adjusted clock signal 124 is used by the phase locking system 110 to time sample the input 112 to generate the output 114. Under normal operation conditions, the input link clock 122 has a steady period; therefore, the phase locking feedback control system 120 will converge on a steady state amount. Thus, the locking feedback control system 120 will generate adjusted link clock 124 indicative of the amount and direction that the input link clock 122 is shifted—vector that will remain constant once the phase locking system 110 has achieved lock. Once the system reaches this steady state, a locking cut-off mechanism 126 causes the phase locking feedback control system 120 not to track phase deviations between the output 114 and the input 112.

In one embodiment, a test data pattern (for example, "101010101010 . . . ") is initially sent as the input 112 to the phase locking feedback control system 120. The test data pattern may be chosen to have a transition each cycle to allow the phase locking feedback control system 120 to lock quickly. Once the phase locking feedback control system 120 has locked onto the test data pattern, indicating that the output 114 is in a steady phase relationship with the input 112, the system ceases to track phase deviations and transmission of normal data begins.

Environmental factors, such as temperature change and supply voltage drift, can cause a phase shift in the system over time. To correct for such a phase shift, the locking cut-off mechanism 126 could be configured to reactivate phase tracking by the locking control system 120 on a periodic basis to ensure that the output 114 is a correct data stream. Also, detection of an out-of-phase relationship between the output data stream 114 and the input 112 could trigger phase tracking reactivation. Also, the triggering event could include receipt of a predefined data pattern.

Figure 2:
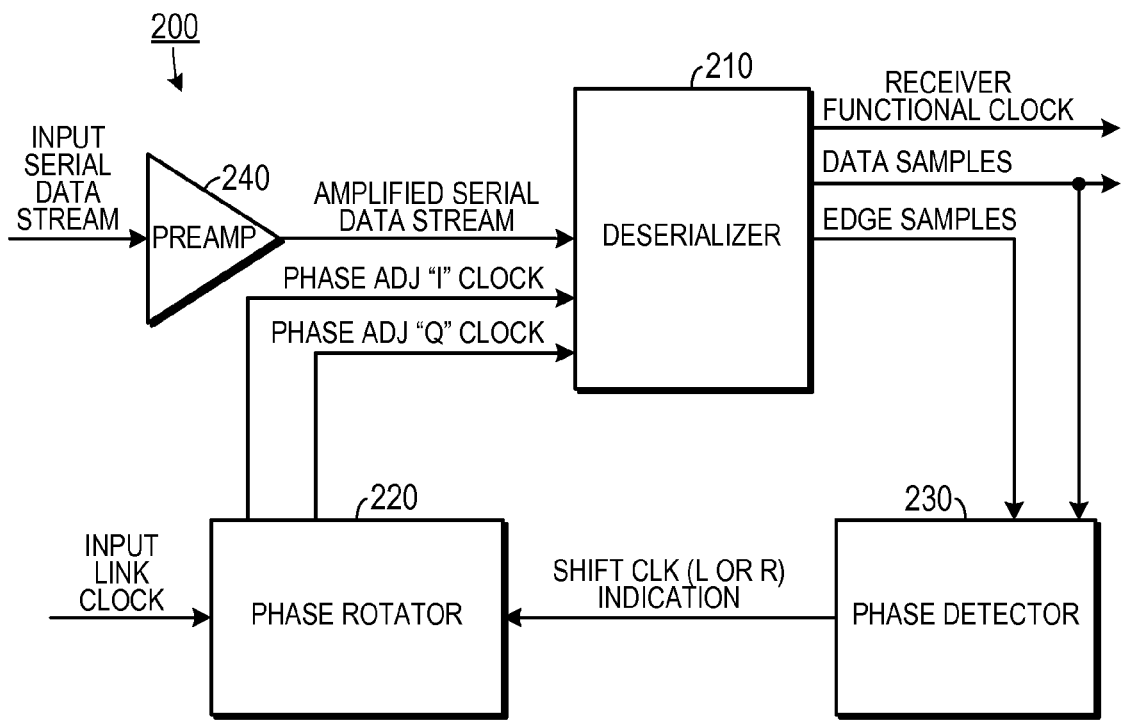
FIG. 2 is a block diagram of a deserializing system.

As shown in FIG. 2, one embodiment is an apparatus 200 for deserializing a serial data stream from a source synchronous system, which sends an input serial data stream and an input link clock signal. In this embodiment, a serial data stream running at a high rate of speed is converted it into a parallel data stream running at a lower speed. This embodiment is sometimes called the 'Des' part of 'SerDes,' or a "serializer-deserializer.

The input serial data stream is initially amplified with a preamplifier 240, which generates an amplified serial data stream. A deserializer 210 samples the amplified serial data stream according to impulses of an adjusted clock signal (which includes a phase adjusted "I" clock signal component and a phase adjusted "Q" clock signal component) and converts the amplified serial data stream into corresponding parallel data samples. The deserializer 210 also generates edge samples, indicative of when it perceives the occurrence of the edge transitions of the data samples, and a receiver functional clock signal that may be used by the recipient of the data samples to determine when the data samples are valid. Typically, the receiver functional clock signal has a period that is a predetermined multiple of the adjusted clock signal period corresponding to the number of serial data bits used to make a parallel data packet.

A phase detector 230 detects a phase difference between the parallel data samples and the edge samples. Based on the phase difference, it generates a shift clock signal that indicates the amount of time and the direction that the adjusted clock signal must be shifted from the input link clock signal so that the parallel data samples accurately correspond to the input serial data stream. Once the data samples and the edge samples indicate that the amplified serial data stream is being sampled with the correct timing, the phase detector generates a fixed value of the shift clock signal.

A phase rotator 220 receives the shift clock signal and the input link clock signal from the source synchronous system. The phase rotator 220 generates the adjusted clock signal (including the phase adjusted "I" clock signal component and a phase adjusted "Q" clock signal component) so that the adjusted clock signal corresponds to the input link clock signal shifted by an amount of time and in a direction indicated that causes the deserializer 210 to generate data samples at the correct time. The adjusted "I" clock (or "in-phase") clock signal is typically used for generating data samples and the adjusted "Q" clock (or "quadrature") clock signal is typically used for generating edge samples.

The deserializer 210 takes samples of the amplified data stream to create a running stream of data and edge samples. These samples are used by the phase detector 230 to decide whether or not the phase adjusted clocks are properly aligned with the input serial data stream. The phase adjusted clocks are copies of the input link clock, but can be shifted in time as by the phase rotator 220 directed by the phase detector 230 so that they can be aligned in time with the input serial data stream. In this embodiment, the phase rotator 220 creates two clocks from the input link clock, which are called the phase adjusted 'I' clock (in-phase) and the phase adjusted 'Q' clock (quadrature), and shifts them in time earlier or later as commanded by the phase detector 230. The deserializer 210 uses the I-clock to create data samples and the Q-clock to create edge samples of the amplified serial data stream. Once the data and clocks are aligned the receiver loop is locked and delivers good data in the form of the data samples to any downstream units using the parallel data samples.

When the data and clock are not aligned properly the information contained in the data and edge samples can be used by the phase detector 230 to decide whether the clocks should be shifted earlier('left') or later('right') by the phase rotator 220 relative to the data stream. Eventually, the proper alignment will be achieved and thus the loop will be in the locked condition. Once the loop is locked, the data samples are presumed to be good and the downstream unit can process them. Also, once the loop is locked the edge samples are no longer necessary.

It is assumed that the input serial data stream and the input link clock are run at the same frequency and are thus a source synchronous pair of signals. This means that this phase locked loop does not need to track a frequency drift caused by local crystal tolerances, but only must achieve phase lock initially to deserialize the input data stream correctly. Once the receiver has achieved phase lock, the loop no longer needs to be closed. The loop can be 'opened' or 'unlocked' and the system will still deserialize the data correctly. Therefore, some elements of the feedback loop (including the deserializer, phase detector, and phase rotator) can be allowed to unlock yet the receiver will still deserialize the input data correctly and produce good output data samples to the final destination for long periods of time.

This feature of source synchronous links can be used for two purposes: (1) saving power—the phase detector 230 can be completely shut off, and also the circuits associated with creating the edge samples in the deserializer 210 can be shut off. Also, inside of the phase rotator 220 the circuits associated with the Q clock can be shut off, since that clock is only used for taking edge samples. So quite a bit of power savings can be achieved by shutting down the circuits that are used by the receiver to achieve lock, but that are no longer needed once that locked condition is achieved; (2) special pattern training—if the complexity of the input data stream is such that having the loop constantly tracking would cause unacceptable drift between the clock and data, the unlock mode can allow filtering of this effect from the system. The receiver loop could be intentionally locked only when a special training pattern is being sent and then after the training pattern is complete, the loop could be opened. This could be useful in a data link where there is a likelihood of receiving runt pulses. Runt pulses, which are shrunken in time, can be missed by some deserializers because the leading edge of the pulse is too late and the trailing edge of the pulse is too early. Using a clock pattern to train the link and then unlocking the receiver loop would allow these runt pulses to be detected consistently, because the special clock pattern would be centered in the data stream with the special pattern. Another example is a data stream that doesn't change very often; in this case, it may not be desirable to have a loop track try to track this data because the loop might get lost since the data is not changing very often. Therefore, it may be better to lock the loop with a special training pattern that has lots of transitions and then unlock the loop later when the slowly changing data is received. Thus, this embodiment takes advantage of the fact that a source synchronous receiver loop can operate for long periods of time without needing to be completely locked.

The mechanics of closing and opening the loop can be handled in any number of simple ways. The system could sense when the loop achieves lock by checking the output of the phase detector 230 and noticing that it has not issued any shift clocks right/left commands for a certain amount of time. Then the system would know that the loop has achieved lock and can open the loop and shut down the circuits that are not needed any more. Or the system could have a control bit sent from the transmitter that indicates when the input data stream is starting or finishing and this could control whether or not the receiver loop is open or closed. The system could also employ a circuit to sense when temperature or voltage has drifted enough such that the proper alignment of clock and data has become a concern and it needs to close the receiver loop for a while to make sure it is tracking the data correctly.

If the system uses a multi-bit link, it could turn on one bit lane at a time to make sure power usage is spread out evenly. For example, a system employing a 16-bit link could avoid a power surge by turning on one of the 16 receiver loops at a time and spread the power usage out over time to cut down on the surge and eliminate noise.

Figure 3:
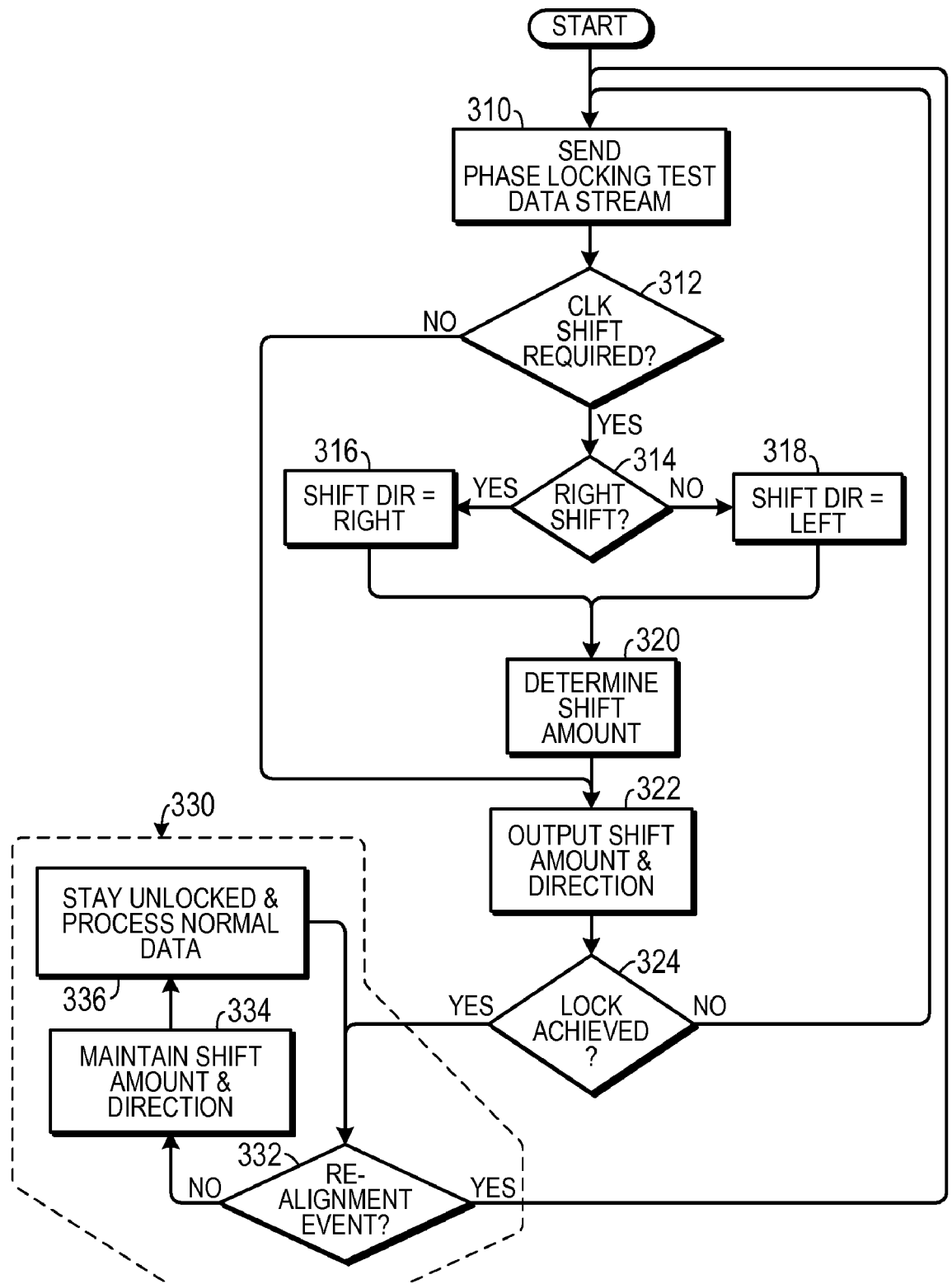
FIG. 3 is a flow chart showing a method of operating a source synchronous receiving system.

In operation, as shown in FIG. 3, the system initially sends a test data stream 310 to the deserializer. If the parallel data samples indicate that a clock shift is required 312, then the system determines the direction of the shift 314 (either a right shift 316 or a left shift 318) and a shift amount 320 and then generates the shift clock indication 322. If the lock has been achieved 324, then the system enters a normal operation mode 330; otherwise, it continues to send the test data stream 310.

In the normal operation mode 330, the system determines if an event that would cause the data to be readjusted has occurred 332 and, if not, the shift clock indication will be maintained at its current value 334, the system will enter unlock mode and will process normal data 336.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A phase locked loop that generates an output corresponding to a source synchronous input and an input link clock signal, comprising:
   a. a phase locking feedback system that receives the source synchronous input and an input link clock signal, the phase locking feedback system configured to detect phase deviations between the output and the source synchronous input and to adjust an adjusted clock signal based on the phase deviations thereby causing the phase locking feedback system to generate the output so that the output has a steady phase relationship with the source synchronous input; and
   b. a first mechanism that causes the phase locking feedback system not to track phase deviations between the output and the source synchronous input upon occurrence of a first predefined event, thereby maintaining the adjusted clock signal at a constant state.

2. The phase locked loop of claim 1, wherein the first predefined event comprises a detection that the output has a steady phase relationship with the input.

3. The phase locked loop of claim 1, further comprising a second mechanism that causes the phase locking feedback system to track phase deviations between the output and the input upon occurrence of a second predefined event.

4. The phase locked loop of claim 3, wherein the second predefined event comprises a detection that the output is in an out-of-phase relationship with the input.

5. The phase locked loop of claim 3, wherein the second predefined event comprises a detection that a predetermined period has passed since the first predefined event.

6. An apparatus for deserializing a serial data stream from a source synchronous system having a corresponding input link clock signal, comprising:
  a. a deserializer, responsive to the serial data stream and an adjusted clock signal that has an adjusted clock signal period, that generates a stream of parallel data samples corresponding to the serial data stream and that also generates a receiver functional clock signal so that the receiver functional clock signal is indicative of when each of the parallel data samples is valid, the receiver functional clock signal having a period that is a predetermined multiple of the adjusted clock signal period, the deserializer also generating a stream of edge samples indicative of a corresponding plurality of value transitions of the parallel data samples;
  b. a phase rotator, responsive to a shift clock signal and to the input link clock signal from the source synchronous system, that generates the adjusted clock signal so that the adjusted clock signal corresponds to the input link clock signal shifted by an amount of time and in a direction indicated by the shift clock signal; and
  c. a phase detector, responsive to the parallel data samples and the edge samples, that generates the shift clock signal so as to indicate the amount of time and the direction that the adjusted clock signal must be shifted from the input link clock signal so that the parallel data samples accurately correspond to the input serial data stream, the phase detector configured to generate a fixed value of the shift clock signal upon an occurrence of a first predefined event.

7. The apparatus of claim 6, wherein the first predefined event comprises a detection that the shift clock signal is stable.

8. The apparatus of claim 6, wherein the phase detector is further configured to generate a changeable value of the shift clock signal upon an occurrence of a second predefined event.

9. The apparatus of claim 8, wherein the second predefined event comprises an expiration of a predetermined period of time.

10. The apparatus of claim 8, wherein the second predefined event comprises an abnormal operation detection.

11. The apparatus of claim 6, wherein the adjusted clock signal comprises:
  a. a phase adjusted in-phase clock signal; and
  b. a phase adjusted quadrature clock signal.

12. The apparatus of claim 6, further comprising a preamplifier that amplifies the serial data stream and transmits an amplified serial data stream to the deserializer.

13. A method of operating a deserialzer that deserializes a serial data stream into a parallel data stream, comprising the actions of:
  a. generating a parallel data stream corresponding to the serial data stream based on an adjusted clock signal;
  b. detecting a phase shift direction and amount of the adjusted clock signal necessary to align the adjusted clock signal with the serial data stream based on the parallel data stream;
  c. adjusting the adjusted clock signal by the phase shift direction and amount;
  d. detecting when the parallel data stream is in phase with the serial data stream; and
  e. ceasing to adjust the adjusted clock signal once the parallel data stream is in phase with the serial data stream;
  f. after the action of ceasing to adjust the adjusted clock signal, detecting a predefined event;
  g. after detecting the predefined event,
    i. detecting a phase shift direction and amount of the adjusted clock signal necessary to align the adjusted clock signal with the serial data stream based on the parallel data stream;
    ii. adjusting the adjusted clock signal by the phase shift direction and amount; and
  h. ceasing to adjust the adjusted clock signal when the parallel data stream is in phase with the serial data stream.
  wherein the predefined event comprises an expiration of a predetermined amount of time since the action of ceasing to adjust the adjusted clock signal.

14. The method of claim 13, wherein the action of detecting a phase shift direction and adjusting the amount of the adjusted clock signal occurs during a period in which a test data pattern is received as the serial data stream.

15. The method of claim 13, further comprising the action of adjusting an input link clock signal to generate the adjusted clock signal, the input link clock signal corresponding to a timing element of the serial data stream.

16. The method of claim 13, wherein the action of detecting a phase shift direction and amount comprises comparing at least one data sample to at least one edge sample from the parallel data stream.

17. The method of claim 13, wherein the adjusted clock signal includes a phase adjusted in-phase clock signal and a phase adjusted quadrature clock signal.

18. A method of operating a deserialzer that deserializes a serial data stream into a parallel data stream, comprising the actions of:
  a. generating a parallel data stream corresponding to the serial data stream based on an adjusted clock signal;
  b. detecting a phase shift direction and amount of the adjusted clock signal necessary to align the adjusted clock signal with the serial data stream based on the parallel data stream;
  c. adjusting the adjusted clock signal by the phase shift direction and amount;
  d. detecting when the parallel data stream is in phase with the serial data stream; and
  e. ceasing to adjust the adjusted clock signal once the parallel data stream is in phase with the serial data stream;
  f. after the action of ceasing to adjust the adjusted clock signal, detecting a predefined event;
  g. after detecting the predefined event,
    i. detecting a phase shift direction and amount of the adjusted clock signal necessary to align the adjusted clock signal with the serial data stream based on the parallel data stream;
    ii. adjusting the adjusted clock signal by the phase shift direction and amount; and
  h. ceasing to adjust the adjusted clock signal when the parallel data stream is in phase with the serial data stream,
  wherein the predefined event comprises a detection that the parallel data stream is out of phase with the serial data stream.

19. The method of claim 18, wherein the predefined event comprises an expiration of a predetermined amount of time since the action of ceasing to adjust the adjusted clock signal.

20. The method of claim 18, wherein the adjusted clock signal includes a phase adjusted in-phase clock signal and a phase adjusted quadrature clock signal.

* * * * *